United States Patent [19]

Kurtz

[11] Patent Number: 5,405,786

[45] Date of Patent: Apr. 11, 1995

[54] STRESS SENSITIVE P-N JUNCTION DEVICES FORMED FROM POROUS SILICON AND METHODS FOR PRODUCING THE SAME

[75] Inventor: Anthony D. Kurtz, Teaneck, N.J.

[73] Assignee: Kulite Semiconductor Products, Inc., Leonia, N.J.

[21] Appl. No.: 237,011

[22] Filed: Apr. 29, 1994

Related U.S. Application Data

[62] Division of Ser. No. 168,465, Dec. 16, 1993.

[51] Int. Cl.$^6$ .............................................. H01L 21/04
[52] U.S. Cl. ...................................... 437/15; 437/901; 437/974
[58] Field of Search ................... 437/15, 71, 901, 974; 148/DIG. 1 L, DIG. 159; 257/417

[56] References Cited

U.S. PATENT DOCUMENTS

| | | | |
|---|---|---|---|
| 3,995,247 | 11/1976 | Kurtz | 338/43 |
| 4,016,644 | 4/1977 | Kurtz | 437/901 |
| 4,204,185 | 5/1980 | Kurtz et al. | 338/4 |
| 5,155,061 | 10/1992 | O'Connor et al. | 437/901 |
| 5,250,460 | 10/1993 | Yamagata et al. | 148/DIG. 12 |
| 5,277,748 | 1/1994 | Sakaguchi et al. | 437/71 |
| 5,285,078 | 2/1994 | Mimura et al. | 457/3 |
| 5,298,767 | 3/1994 | Shor et al. | 437/87 |

FOREIGN PATENT DOCUMENTS 5513910   1/1980   Japan ................................. 257/419

OTHER PUBLICATIONS

*Pourous silicon formation mechanism*, Journal of Applied Physics, vol. 71, No. 8 R1, R. L. Smith and S. D. and S. D. Collins, pp. R1-R22 (Apr. 1992).

Primary Examiner—Olik Chaudhuri
Assistant Examiner—S. Mulpuri
Attorney, Agent, or Firm—Arthur L. Plevy

[57] ABSTRACT

Stress sensitive P-N junction devices are fabricated by forming a porous layer in a semiconductor of a given conductivity, diffusing dopants of the opposite conductivity into the porous layer and forming a non-porous layer on the porous layer. This results in a microporous structure having a plurality of microcrystalline regions extending therethrough, which enhances the quantum confinement of energetic carriers and results in a device which is highly sensitive to stress.

10 Claims, 7 Drawing Sheets

STRESS SENSITIVE P-N JUNCTION DEVICES FORMED FROM POROUS SILICON AND METHODS FOR PRODUCING THE SAME

This is a Division of application Ser. No. 08/168,465, filed Dec. 16, 1993.

RELATED APPLICATIONS

The assignee herein, Kulite Semiconductors Products is the record owner of U.S. patent application entitled "POROUS SILICON CARBIDE (SIC) RELATED METHODS AND APPARATUS", Ser. No. 08/115,983, filed on Sep. 1, 1993 for J. S. Shor et al. which is a continuation-in-part of U.S. application entitled "POROUS SILICON CARBIDE (SIC) RELATED METHODS AND APPARATUS", Ser. No. 07/957,519, filed on Oct. 6, 1992 for Anthony D. Kurtz et al. See also U.S. patent application 08/071,669 filed Jun. 2, 1993 entitled "FIELD EFFECT DEVICES FORMED FROM POROUS SEMICONDUCTIVE MATERIALS AND A METHOD FOR FABRICATING THE SAME" by Anthony D. Kurtz et al. and assigned to Kulite; U.S. patent application 08/058,016, filed on May 7, 1993 for Anthony D. Kurtz et al. entitled "SEMICONDUCTOR STRUCTURES HAVING ENVIRONMENTALLY ISOLATED ELEMENTS AND METHOD FOR MAKING THE SAME" and U.S. patent application Ser. No. 08/078,392 entitled "IMPROVED PIEZOOPTICAL PRESSURE SENSITIVE SWITCH AND METHODS FOR FABRICATING THE SAME", filed on Jun. 16, 1993 for Anthony D. Kurtz.

1. Field of the Invention

This invention relates to semiconductor devices in general and more particularly, to stress sensitive devices fabricated from porous semiconductors.

2. Background of the Invention

It has long been known that the application of a stress can effect both the forward and reverse characteristics of P-N diodes in semiconductors. However, the prior art has required either very high hydrostatic pressures (on the order of 5000 to 10,000 PSI) or some form of external stress concentration (a sharp point which presses on the junction coupled with a large force collector).

In the present invention, the use of internal P-N junctions in porous semiconductors will allow large changes in both if re forward and reverse characteristics at much lower applied stresses without the need for external stress concentrators i.e. outside the semiconductor structure. Porous silicon as formed by anodic reaction can consist of a series of very thin tubular pores arranged at right angles to the original surface of the wafer. The thickness of the resulting silicon rods can be of the order of 10000 Å or less (down to 50 Å, or less).

Moreover because of the very thin cross section (below 100 Å) it has been postulated that charge carriers can be confined in "Quantum Wells" and as such, has the effect of increasing the measured energy gap of the porous material. Other structures with small cross sections but greater in "diameter" than 100 Å are also useful because of stress concentration effects.

For example, a P porous P-N structure results from taking a wafer of semiconductor material of one doping type, (i.e. n type); partially converting the wafer to porous material of the requisite wall thickness and pore size; forming a plurality of parallel internal P-N junctions on the surface of the crystallites by diffusing an impurity of the opposite type and growing on the porous face, an external or epitaxial layer of an opposite type to the starting material, such that the external layer contacts the diffused layer of the porous material. When a pressure or stress is applied to the epitaxial layer or cover a significant amount of internal stress magnification will result depending on the degree of porosity and the size and shape of the crystallites. By control of the anodic reaction process used to form the internal pores, the degree of stress enhancement can therefore, be controlled.

As is well known, the application of stress can change conductivity in a semiconductor by two separate mechanisms:

a) Change of the energy gap.

b) In multivalley semiconductors, change of the relative population of the various valleys. In a semiconductor with anisotropic effective mass (in momentum space) this will change the relative number of "heavy" and "light" carriers with higher or lower mobilities. The greater the stress, the more charge carriers are transferred from one valley to another.

Both of these effects are known to change the characteristics of P-N junctions. The subject matter of the present invention is directed at the use of porous semiconductors to enhance the aforementioned effects. The first effect, namely the direct change of energy gap under high external stress, will clearly be enhanced by the internal stress concentrations, however, the second effect (namely changing the distribution of light and heavy charge carriers) can be more profound.

In a Zener diodes; for instance, it is presumed that reverse breakdown occurs from tunneling. It is known that the breakdown could be effected by large external stresses, which presumably creates more light carriers which could more easily tunnel through any barrier. In porous material these tunneling processes can occur at much lower external stresses. In addition, in the region of "Quantum Confinement" an increase in the number of light carriers can make the confinement less effective thus lowering the effective energy gap. The same basic arguments can also apply to the forward direction of such a diode.

Thus by biasing a reverse biased diode very near the breakdown point, application of an appropriate stress can cause the diode to switch from a low to a high conduct state or vice versa. Use of porous material with (or without) internal P-N junctions will cause this to occur at relativity lower external stresses and obviate the need for costly complex external stress concentrators.

The change from low to high conductive electrical resistivity of a semiconductor when a stress is applied along certain crystallographic directions is known as the piezoresistive effect. The use of the piezoresistive effect in semiconductors has resulted in the construction of electromechanical force transducers, pressure transducers, signal devices, and microphones. For an example of a pressure sensor employing the piezoresistive effect, see U.S. Pat. No. 4,204,185 entitled INTEGRAL TRANSDUCER ASSEMBLIES EMPLOYING THIN HOMOGENEOUS DIAPHRAGMS, issued to Anthony D, Kurtz and Richard A. Weber on May 20, 1989 and assigned to the assignee herein. For an example of a piezoresistive force transducer see U.S. Pat. No. 3,995,247 entitled TRANSDUCERS EM- PLOYING GAP-BRIDGING SHIM MEMBERS issued to Anthony D. Kurtz on Nov. 30, 1976 and assigned to the assignee herein.

Of late, there has also been renewed interest in SiC as a semiconductor material. Its wide band-gap, high thermal conductivity, high breakdown electric field, and high melting point make SiC an excellent material for high temperature and high power applications. In U.S. patent application Ser. No. 07/957,519, the present applicants disclose methods of forming a new semiconductor material, porous SiC by electrochemical anodization of monocrystalline SiC. It is expected that the microporous structure of porous silicon carbide exhibits the same capacity for quantum confinement as that of porous silicon.

It is an object of the present invention to advantageously utilize porous semiconductor materials, such as silicon and silicon carbide, in the fabrication of improved stress sensitive device which are economical to produce and which do not require the use of expensive, specially designed external stress concentrating elements.

SUMMARY OF THE INVENTION

A stress sensitive semiconductor device employing a plurality of internal P-N junction formed in a porous layer of a semiconductor material is obtained by forming said porous layer in a semiconductor wafer having a given conductivity, diffusing dopants of an opposite conductivity type into the surface of the wafer, and forming a non-porous layer of the opposite conductivity type on the porous layer.

DETAILED DESCRIPTION OF THE INVENTION

Figure 1:
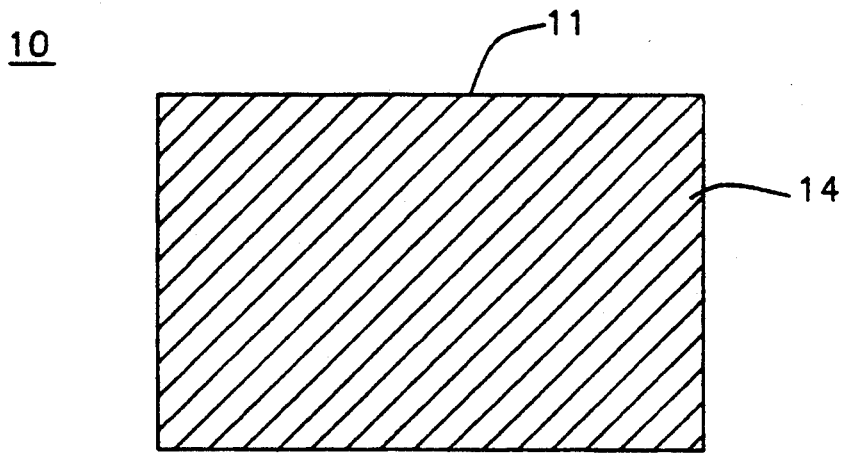
FIG. 1 is a cross sectional view of a substrate of semiconductor material utilized to produce a stress sensitive device in accordance with one embodiment of the present invention.

With reference to FIG. 1, there can be seen a cross-sectional view of a substrate 10. The original substrate 10 is fabricated from a semiconductor material, such as silicon or silicon carbide, which is preferably monocrystalline in structure and doped to obtain a given conductivity. The wafer may be of any desired geometric configuration in the top plan view, such as rectangular or circular. In accordance with an illustrative embodiment of the method of the present invention, the substrate 10 is formed of monocrystalline silicon carbide doped with an N conductivity type impurity. It will, of course, be appreciated that the substrate might also be constructed of other semiconductor materials, that the conductivity type of the substrate utilized to form the internal P-N junctions of the present invention may be n- or p-type as desired, and that the processing of an n-type substrate is described for illustrative purposes only.

Figure 2:
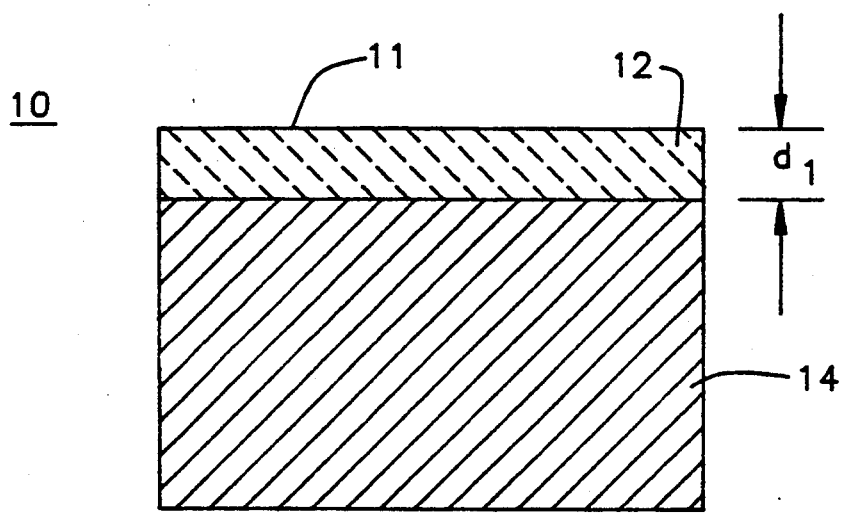
FIGS. 2-5 illustrate various steps of forming P-N junction diodes in a porous layer of a semiconductor material for use in a stress sensitive device according to this invention.

The n-type silicon carbide substrate 10 is treated so that a layer of porous silicon carbide is formed from a portion thereof, as shown in FIG. 2. There is extensive literature in the prior art relating to the formation of porous semiconductors and reference may be had to an article by R. L. Smith and S. D. Collins appearing in the Journal of Applied Physics, Volume 8, R1 (1992) for a detailed description of porous silicon formation mechanisms. Methods of forming porous layers in silicon carbide are described in U.S. patent application Ser. No. 07/957,519, the disclosure of which is incorporated herein by reference.

In accordance with a technique such as the method of forming porous silicon carbide disclosed in the aforementioned patent application, the substrate 10 is electrochemically photoanodized so that the n-type silicon carbide becomes porous to a predetermined depth, thereby forming a porous layer 12 disposed over nonporous layer 14. There are a wide variety of fabrication conditions which result in pore formation, and the microstructure, pore size, pore spacing, and morphology of the semiconductor material is dependent upon the process parameters. Prior to photoanodization, the back side of the substrate is coated with a layer of aluminum to provide a low resistance electrical contact. Except for the exposed surface 11, the substrate 10 together with a copper strip for electrical connection, is encapsulated in a suitable encapsulant such as black wax. The encapsulated chip is placed in an electrochemical cell containing an electrolyte such as, for example, a dilute hydrofluoric acid solution. The cell has a platinum wire counter-electrode and a saturated calomel reference electrode. The substrate acts as the working electrode and is biased with respect to the saturated calomel electrode at a suitable potential for the n-type layer to photo corrode.

Ultraviolet (UV) light illuminates the upper surface of the substrate. The depth of the porous n-type layer and its structure is determined by the anodization time, the UV light intensity, the applied potential, the pH, and the doping levels of the crystals. Because the anodic current increases with potential and becomes insensitive to illumination at higher potentials, the anode potential for n-type silicon is preferably between 0 and 2 $V_{sce}$ (see=saturated calomel electrode). The wavelength of light λ which is used to photo-anodize the portion of the substrate which will become the porous n-type layer 12 is selected so that the absorption depth $1/\alpha$ of the light in silicon carbide is roughly equal to the thickness $d_1$ of the layer 12, as shown in FIG. 2.

The resulting pores formed in layer 12 are generally of submicron dimensions, with the pore sizes typically ranging from 5-100 nm and the interpore spacing being on the order of 5-150 nm. As such, the porous layer 12 exhibits a very large surface area. The resulting microporous structure comprises a plurality of crystallite regions arranged at right angles to the surface 11 of the wafer and extending through the thickness of the porous layer. The nominal cross sectional dimension of each region is very small, being on the order of 5-100 nm, and the geometrical configuration may vary from tubular to polygonal. It is believed that the submicron dimensions of these regions are responsible for the confinement of the energetic carriers in quantum wells, and that this confinement increases the measured energy gap of the porous material.

Figure 3:
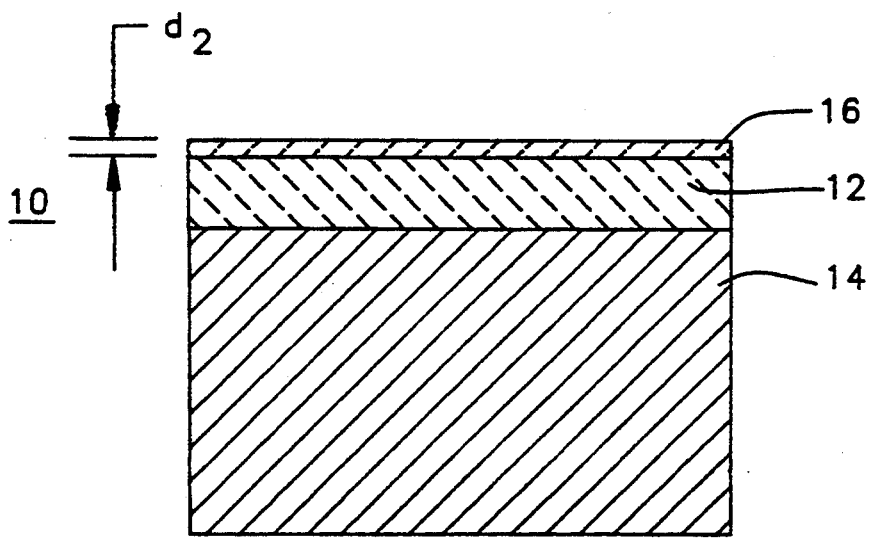
Figure 4:
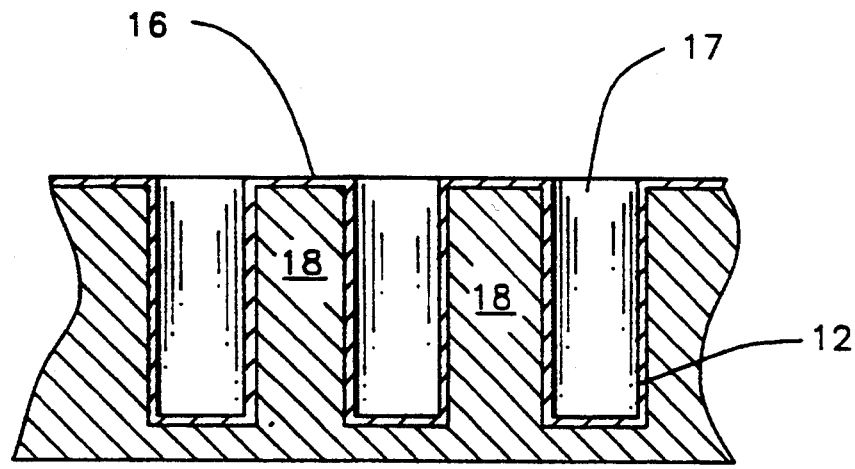

After the porous layer 12 has been formed on the N-type substrate 10, a plurality of parallel, internal P-N junctions are formed by introducing high concentration, P-type impurities to a selected depth $d_2$ of the porous layer 12. This results in the formation of a very thin opposite conductivity layer 16 as shown in FIG. 3. The large surface area of the porous layer provides for a large area pn-junction. Techniques for the formation of highly doped P regions in an N-type semiconductor are well known, these including diffusion, ion implantation or in-situ epi-growth. Accordingly, in order to pro&ace the highly doped P-type portion of the porous layer 12, one may use a diffusion technique utilizing a sufficient concentration of group III impurities such as aluminum or boron. In the case of silicon carbide, the diffusion coefficients of all dopant impurities are very low at the typical range of semiconductor diffusion temperatures, which is between 1000° axed 1300° C. However, since the porous network contains microcrystalline areas of 5–10 nm dimension, it has been found that a very thin layer of between 2 and 4 nm produces satisfactory results and can be obtained in silicon carbide at such temperatures. A partial sectional view of the P-N junctions showing the arrangement of individual pores 17 and crystallite regions 18 at the porous P-N interface are shown in FIG. 4.

Figure 5:
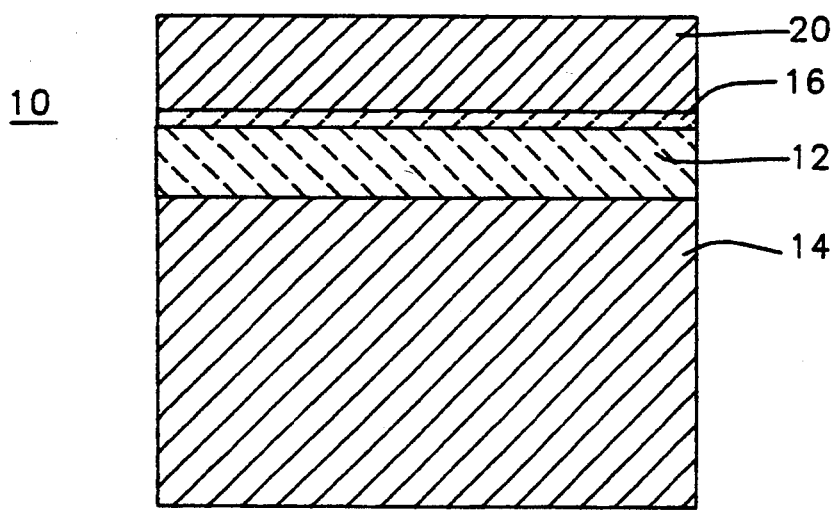

Referring to FIG. 5, the next step in the procedure is depicted. After formation of the highly doped thin opposite conductivity layer 16, a single crystal layer 20 of the same conductivity is then grown or otherwise deposited on a surface thereof using a well known technique. Epitaxial layers of silicon or silicon carbide may, for example be obtained by low temperature chemical vapor deposition on the porous layer. The epitaxial growth can be performed in a rapid thermal processing-CVD reactor using silane diluted in hydrogen at a temperature of 830° C. and a total pressure of about 2 Torr. The thickness of the epitaxial layer will vary with the processing time. The growth of non-porous epilayers on highly doped porous substrates of silicon has been demonstrated and reference may be had to Volume 139, No. 12 of the Journal of the Electrochemical Society (1992) for a more detailed description.

The amount of stress magnification which is obtained by the use of the internal p-n junctions formed in the porous layer is determined by the degree of porosity as well as the size and shape of the crystallite regions. Each of these parameters may be optimized to provide the desired degree of stress magnification by controlling the anodic reaction process used to form the internal pores, and by selecting the most suitable doping level and crystallographic orientation of the base substrate.

As is well known, the application of stress can cause a change in the energy gap of a semiconductor, thereby changing its conductivity. Because of the aforementioned higher energy gap and quantum confinement associated with the internal P-N junctions formed in a porous layer of monocrystalline substrate, an ever greater rate of conductivity variation is obtained in response to external stress. As such, enhanced pressure sensitive transducers may be fabricated utilizing an internal porous layer having a plurality of p-n junctions.

The suitability of p-n junctions formed in porous microcrystalline semiconductor layers for pressure sensitive devices is suggested by other considerations besides the higher energy gap. In multivalley semiconductors, for example, it is known that the application of an external force or strain is accompanied by a change in the relative population of the various valleys. Accordingly, where the semiconductor has an anisotropic effective mass, the application of stress will alter the balance of "heavy" and "light" carders, thereby either reducing or increasing the number of charge carriers having a higher mobility and reducing or increasing the number of charge carriers having a lower mobility. The greater the stress, the greater the number of carriers which are transferred from one valley to the next. As is well known, Zener diodes depend for their operation on the large current rise of a silicon diode in its well-defined reverse breakdown region. The breakdown characteristics of such diodes are such that the voltage increases only by a fraction of a volt over several decades of current. Two distinct breakdown mechanisms exist, depending upon the thickness of the junction. In the case of very narrow junctions, those that have breakdown voltages of less than 5 volts for silicon, breakdown is primarily due to tunneling. In the case of wider junctions, avalanche breakdown is predominant. In the case of the tunneling mechanism, an increase in the temperature causes the forbidden band to become narrower, and hence, the tunneling probability increases and the breakdown takes place at a lower voltage. Similarly, breakdown occurs at lower voltages when large external stresses are applied. Stress induced breakdown may be attributed to the liberation of more "light" energetic carriers, i.e. those which can more easily runnel through the forbidden band. In junctions formed in porous semiconductor materials, these tunneling processes can occur at much lower external stresses than those required for bulk silicon.

Accordingly, Zener diodes fabricated from porous silicon can be fashioned which are much more pressure or stress sensitive than those formed from bulk silicon. Such a diode would be biased in the breakdown region with a constant voltage supply. When a uniaxial or biaxial stress is applied thereto, the resulting shift in the current-voltage characteristic would result in large current changes which could be measured in terms of voltage across a fixed resistor. If the diode is biased very near the breakdown point, application of an appropriate stress can cause the diode to switch from a low to a high conductivity state or vice versa. If the diode is formed in a porous material, this switching will take place at much lower external stress levels, thereby obviating costly and complex external stress concentrators.

Where the substrate 10 is heavily doped with n- or p-type impurities and an opposite conductivity type impurity is diffused into the porous layer 12, the p-n junctions formed therein exhibit electrical characteristics similar to a quantum mechanical tunneling junction (Esaki diode). The electrical connection of the present invention may be employed for Esaki diode devices by introducing N type impurities into the substrate to the point of degeneracy. As is well known, degeneracy is defined as the point at which the concentration of conductivity type determining impurities is sufficiently great that the Fermi-level lies within or very closely approaches the conduction band. The concentration sufficient for degeneracy may also be stated as being of the order of $5 \times 10^{19}$ atoms per cc.

Porous silicon or silicon carbide having internally formed pn-junctions is used to form large area porous pn-junction diode devices. In the discussion that follows, note that like numerals identify like elements.

Figure 6:
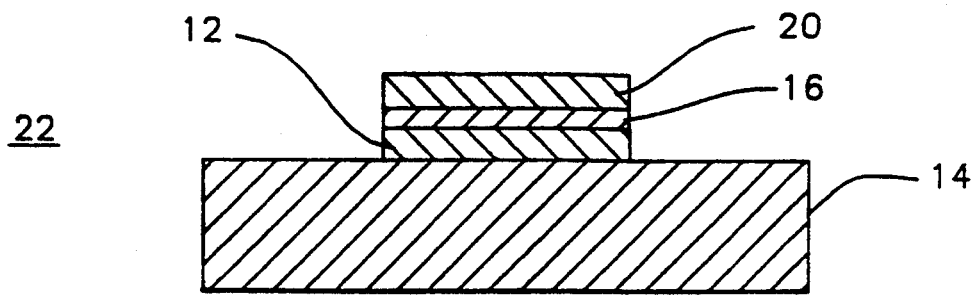
FIGS. 6-13 illustrate various steps of forming stress sensitive diode devices incorporating pn-junction formed internally within the porous layer.
Figure 7:
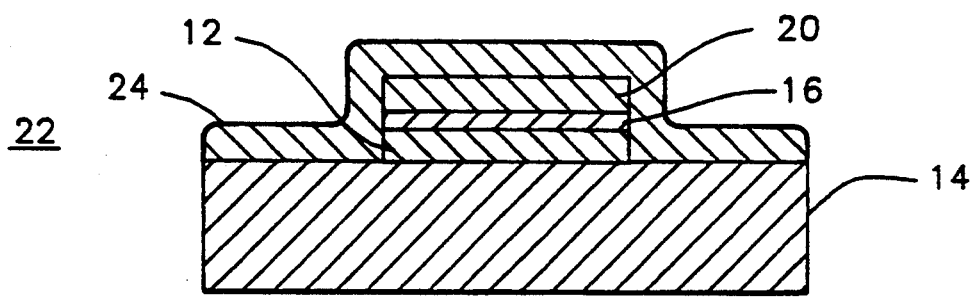
Figure 8:
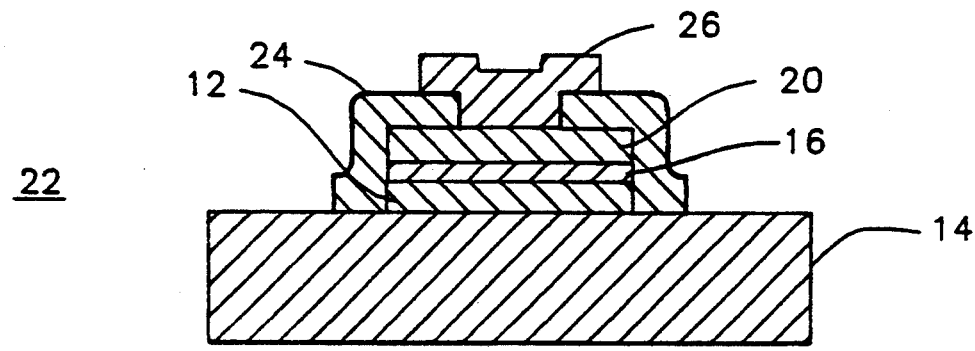

FIG. 8 is a cross-sectional view of a first embodiment of a large area porous pn junction diode designated by the numeral 22. Diode 22 is manufactured by taking the semiconductor device of FIG. 5, formed in accordance with the inventive technique described earlier, and patterning the porous layer 12 and the cover epilayer 20 using well known photolithography and reactive ion etching techniques, thus forming the mesa diode structure shown in FIG. 6. In FIG. 7, a SiN layer 24 is deposited using standard LPCVD methods to cover the edge of the porous layer 12 thus passivating it and forming a hermetic pressure seal. Diode 22 in FIG. 8 is completed by patterning the SiN layer 24 and then depositing a first ohmic contact 26 of a suitable metal such as aluminum on the cover epilayer 20. The thicknesses of the porous layer 12 and the cover epilayer 20 are typically on the order of 5 um. Diode 22 is operated by exerting pressure on the ohmic contact. The pressure is transferred to the porous layer 12 via the cover epilayer 20 which places the porous layer 12 into uniaxial compression. The compressive stresses are concentrated in the porous layer 12 due to its reduced density. In essence, the porous layer 12 acts like a network of springs which compress under the pressure transferred by the cover epilayer 20.

Figure 9:
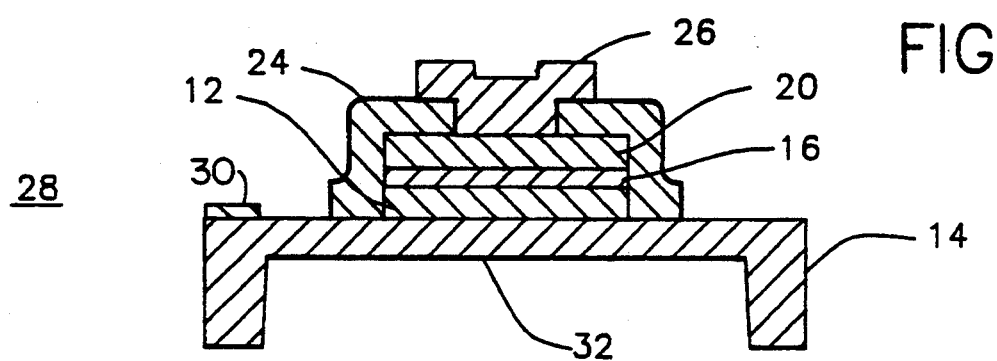

FIG. 9 illustrates a second embodiment of a large area porous pn-junction diode designated by the numeral 28. Diode 28 is manufactured by starting with diode 22 of FIG. 8 and etching the substrate 14 using standard techniques to form a diaphragm 32 configuration. The structure of diode 28 is made more stress sensitive than the structure of diode 22 by the addition of the diaphragm section 32 which allows substrate 14 to deflect under lower applied pressures. The cover epilayer 20 and diaphragm 32 are adjusted to a thickness of 1 to 5 um.

Figure 10:
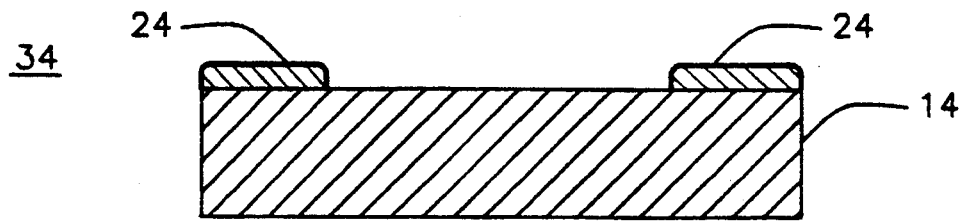
Figure 11:
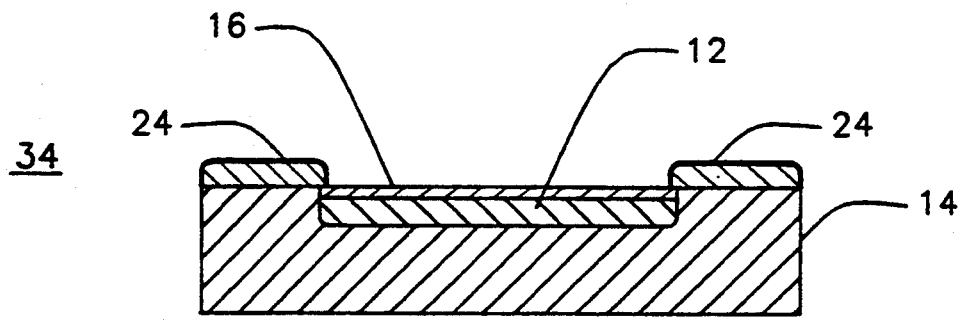
Figure 12:
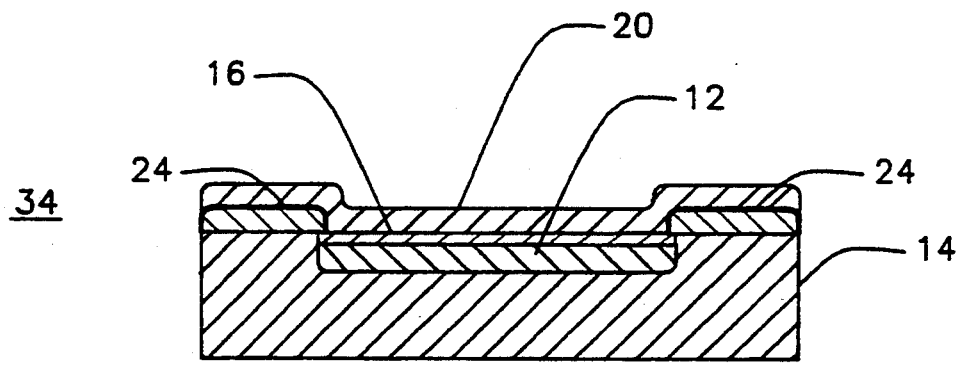
Figure 13:
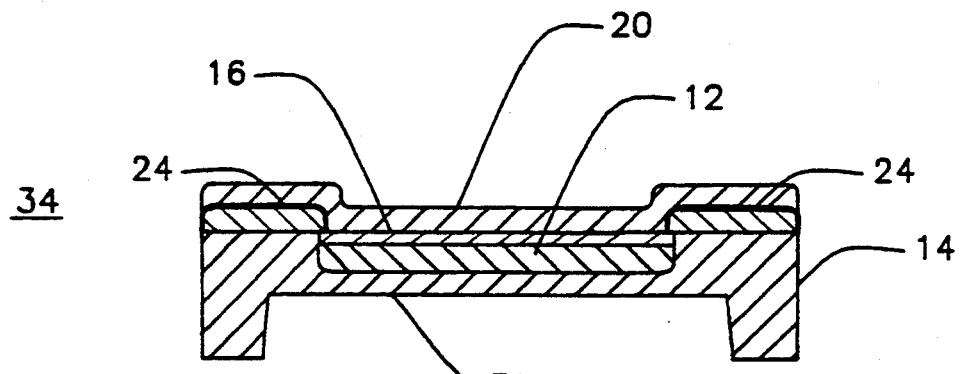

FIG. 13 shows a third embodiment of a large area porous pn-junction diode designated by the numeral 34 wherein the porous pn-junction layer 12 is formed in the diaphragm 32 and not as a mesa structure of FIGS. 6-9. Diode 34 is formed by depositing a layer of SiN 24 on an n-type silicon substrate 14 and then patterning the SiN layer 24 as shown in FIG. 10. In FIG. 11, the substrate 14 is anodized as previously described to form a porous layer 12. Note that the thickness of the porous layer 12 is adjusted, (typically in the range between 4 and 40 um), so that it occupies most of the volume of the device. In FIG. 12, the porous layer 12 is diffused with a p-type impurity to form internal porous pn-junctions. A p-type epilayer 20 having the same conductivity as the diffused layer 16 is grown on top of the substrate 14. The epilayer 20 nucleates as a single crystal directly above the porous layer 12, and a polycrystalline above the SiN layer 24. Substrate 14 is then etched as earlier described to form a diaphragm 32.

Figure 14:
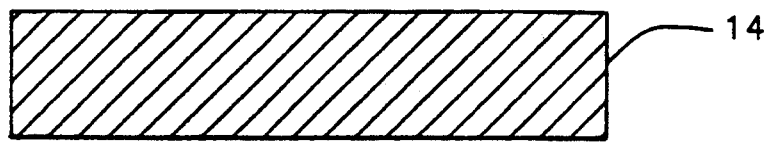
FIGS. 14-17 illustrate various steps of forming stress sensitive diode devices which incorporate pn-junctions formed by an epilayer disposed over a porous layer.
Figure 15:
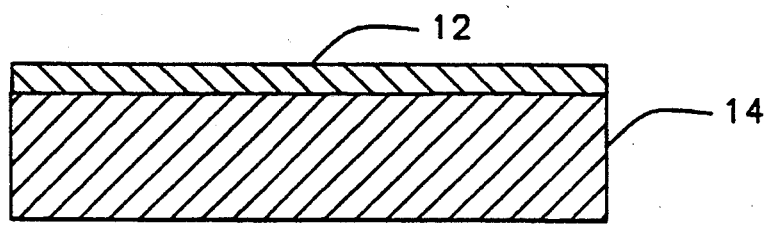
Figure 16:
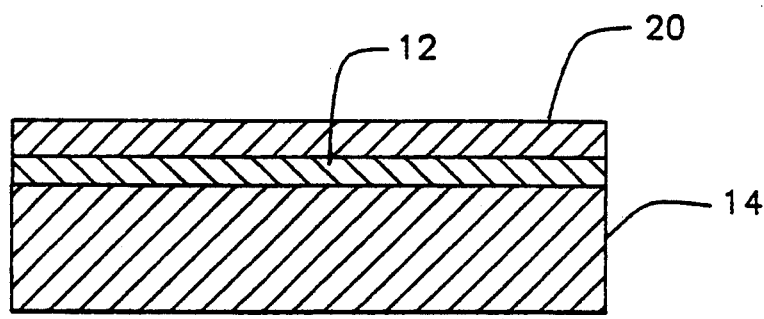
Figure 17:
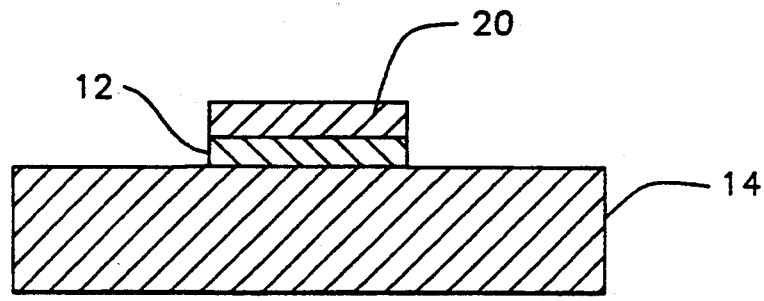

Porous Si or SiC can further be use;d to form large area porous pn-junction semiconductor devices having a structure which includes a epilayer 20 of one conductivity type formed on top of a porous layer 12 of an opposite conductivity type. In this construction, the pn-junctions are formed between the porous layer 12 and the epilayer 20 and not internally within the porous layer itself as described earlier. For example, FIG. 17, illustrates a diode designated by the numeral 36 having the aforementioned structure. In FIG. 14, a n-type substrate is selected and anodized according to the present invention to form a porous layer 12 having a thickness of 1-40 um and a porosity of 50-80 percent as shown in FIG. 15. In FIG. 16, a 1-5 um p-type epilayer is grown over the porous layer 12 to form a pn-junction between the n-type porous layer 12 and p-type epilayer. The pn-junction is mesa etched by well known reactive ion etching techniques to form the final diode structure shown in FIG. 17. Note that diode 36 can include the previously described ohmic contact and diaphragm structures.

Figure 18:
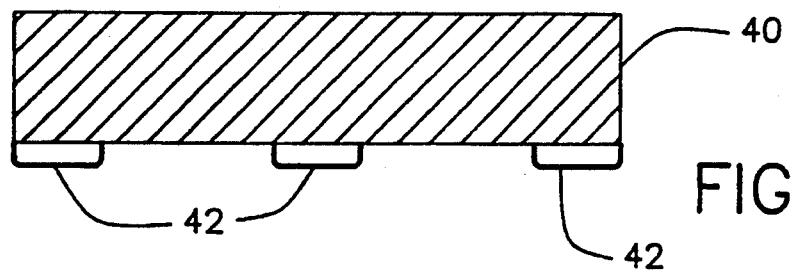
FIGS. 18-22 illustrate various steps of forming a stress concentrator for the stress sensitive device of the present invention.
Figure 19:
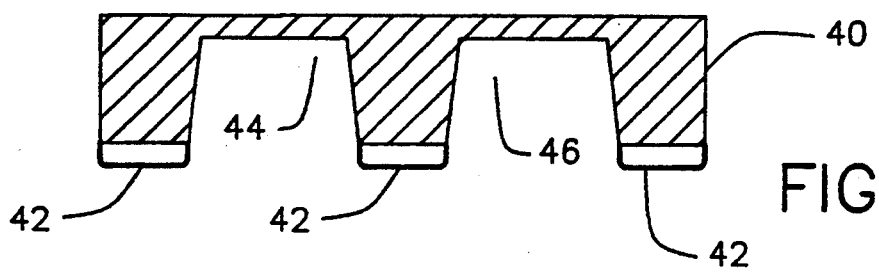
Figure 20:
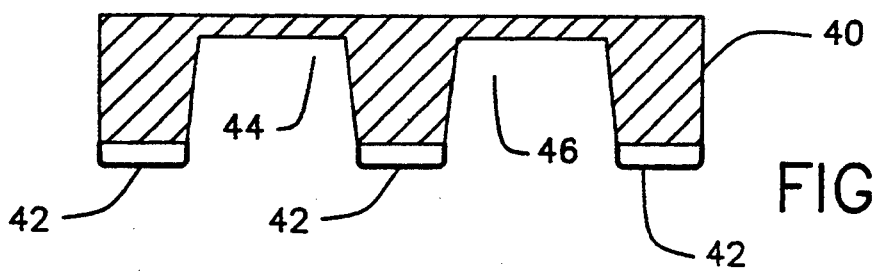
Figure 21:
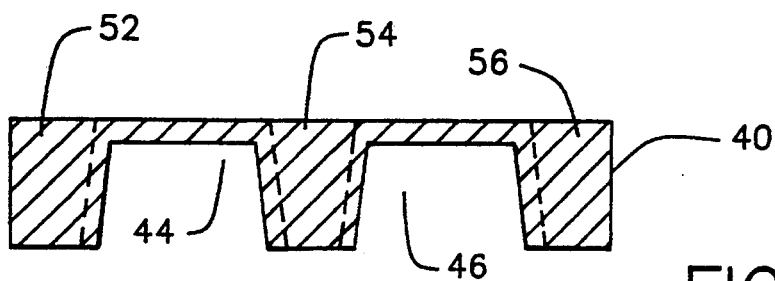
Figure 22:
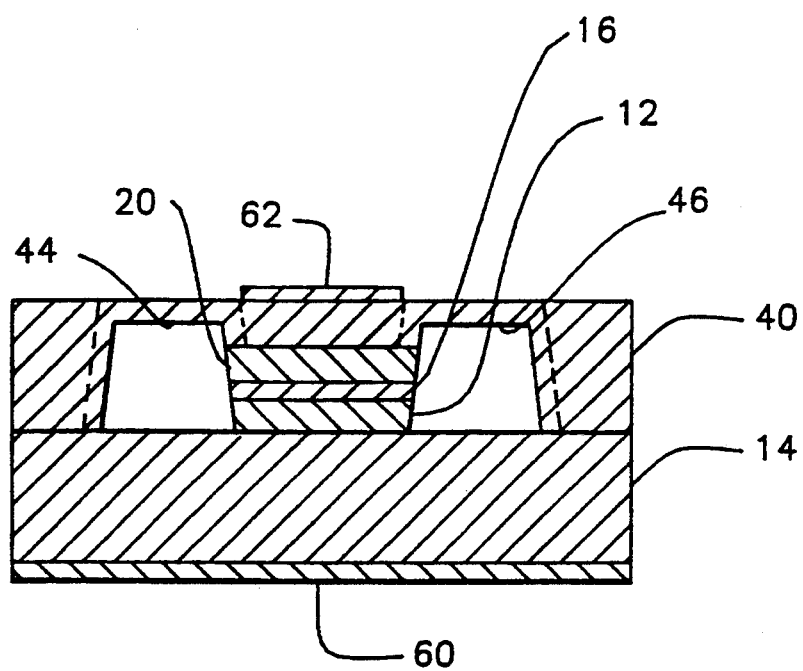

A diode manufactured according to the present invention can include an extended contact Si cover wafer designated by numeral 38. The extended contact cover wafer 38 is used as a stress concentrator and an ohmic contact to the diode. For example, in FIG. 18, a layer 42 of SiN is deposited onto a 3 to 30 mil thick p-type Si substrate 40 using well known techniques and then patterned. In FIG. 19, the substrate 40 is etched in KOH to form interspaces 44 and 46. The thinned areas 48 and 50 have a thickness on the order of 10 to 40 um. In FIG. 20, the substrate 40 is anodized from the SiN layer 42 side to make the interspaces 44 and 46 completely porous while the supports or silicon rods 52, 54 and 56 remain single crystal. In FIG. 21, the substrate is oxidized and then densified to convert the porous interspaces 44 and 46 into amorphous, continuous SiO2. The SiN layer 42 is then removed by etching in phosphoric. The resulting cover wafer 38 is now ready to be bonded to one of the diode structures described earlier such as the one shown in FIG. 6. For a more in depth discussion on extended contacts, see co-pending U.S. patent application Ser. No. 08/058,016, entitled "SEMICONDUCTOR STRUCTURES HAVING ENVIRONMENTALLY ISOLATED ELEMENTS AND METHOD FOR MAKING THE SAME", filed on May 17, 1993. The resulting device is shown in FIG. 22 and includes optional ohmic metal contacts 60 and 62 applied respectively to the bottom of the substrate 14 and to the top of the cover wafer 38. When a pressure is applied to the cover wafer, the SiO2 regions 44 and 46 deflect, causing the central single crystal silicon rod 54 to exert a stress on the diode 22. The low Young's modulus of SiO2 will concentrate the applied pressure causing the device to be more pressure sensitive. The amount of additional stress concentration in the Si cover-wafer 38 structure depends on the ratio of the deflecting area of the cover as compared to the diode area. Contact is make to the diode 22 through the central silicon rod 54. The area of the central p+ region 54 which covers the diode 22 should be larger than the diode area such that the diode 22 is completely covered. The referenced application on extensioned contacts teaches one how to use connections to the devices.

It is also anticipated that such semiconductor stress sensitive devices when constructed utilizing internal P-N junction diodes formed in accordance with the present invention, will be more sensitive than conventional devices.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating a stress sensitive semiconductor device comprising the steps of:
   providing a first substrate of a semiconductor material having a given conductivity;
   forming a porous region on said first substrate, said porous region being of said given conductivity;

doping said porous region to a depth with a dopant having a conductivity opposite to said given conductivity, wherein said selected depth of said porous region having said dopant and said porous region forms an array of p-n junctions extending therethrough; and growing a layer of said semiconducting material on said porous region, said layer being of said conductivity opposite to said given conductivity, wherein said porous region, said selected depth of said porous region having said dopant and said layer form a single large area p-n junction.

2. The method according to claim 1, further comprising the step of forming a diaphragm on said first substrate.

3. The method according to claim 1, further comprising the step of forming said porous region and said layer in a mesa-like configuration.

4. The method according to claim 3, further comprising the step of forming a diaphragm on said first substrate.

5. The method according to claim 3, further comprising the steps of:

providing a second substrate of said semiconducting material having a conductivity opposite to said given conductivity;

forming a plurality of interspaces in said second substrate;

bonding said second substrate to a surface of said first substrate having said mesa-like configuration to provide a stress concentrator for said device; and forming electrical contacts on said first substrate and on said second substrate.

6. The method according to claim 1, wherein said semiconducting material is silicon.

7. The method according to claim 2, wherein said semiconducting material is silicon carbide.

8. A method of fabricating a stress sensitive semiconductor device comprising the steps of:

providing a first substrate of a semiconductor material having a given conductivity;

forming a porous region on said first substrate, said porous region being of said given conductivity; and growing a layer of said semiconducting material on said porous region, forming said porous region and said layer in a mesa-like configuration, said layer being of a conductivity opposite to said given conductivity thereby forming an array of p-n junctions between said porous region and said layer, said p-n junctions being coupled together by said layer as a single large area p-n junction; forming a diaphragm on said first substrate;

providing a second substrate of said semiconducting material having a conductivity opposite to said given conductivity;

forming plurality of interspaces in said second substrate;

bonding said second substrate to said first substrate to providing a stress concentrator to said device; and forming electrical contacts on said first substrate and on said second substrate.

9. The method according to claim 8, wherein said semiconducting material is silicon.

10. The method according to claim 8, wherein said semiconducting material is silicon carbide.

* * * * *